US007394109B2

(12) United States Patent
Lin

(10) Patent No.: US 7,394,109 B2
(45) Date of Patent: Jul. 1, 2008

(54) LED LIGHTING DEVICE

(76) Inventor: Ming-Liang Lin, No. 21, Chung Pu, Chung-Pu Village, Chung-Pu Country, Chia-Yi Hsien (TW)

( * ) Notice: Subject to any disclaimer, the term of this patent is extended or adjusted under 35 U.S.C. 154(b) by 200 days.

(21) Appl. No.: 11/460,250

(22) Filed: Jul. 27, 2006

(65) Prior Publication Data

US 2008/0023723 A1 Jan. 31, 2008

(51) Int. Cl.
*H01L 29/06* (2006.01)

(52) U.S. Cl. .............................. 257/99; 257/13; 257/79; 257/100; 257/E33.056; 257/E33.057; 257/E33.058; 257/E23.059; 257/E25.02; 438/25; 438/26

(58) Field of Classification Search ................... 257/13, 257/79, 99, 100, E33.056, E33.057, E33.058, 257/E33.059, E25.02; 438/25, 26, FOR. 157
See application file for complete search history.

(56) References Cited

U.S. PATENT DOCUMENTS 5,270,555 A * 12/1993 Ito et al. ........................ 257/81
7,078,254 B2 * 7/2006 Loh ............................ 438/26

* cited by examiner

*Primary Examiner*—Long K Tran

(57) ABSTRACT

An LED lighting device comprises a seat with a conductor. A light emitting diode is disposed on the conductor of the seat, and has an upper positive conductive pad, a lower negative conductive pad, and an insulating pad disposed between the positive and negative conductive pads. The lower negative conductive pad of the light emitting diode connects with the conductor. An exterior enclosure is disposed on top of the seat in such a way that a bottom end of the exterior enclosure is in contact with the upper positive conductive pad. A through hole is defined through the bottom end of the exterior enclosure for receiving the light emitting diode. The bottom of the seat is connected with a metal plate that is in contact with the conductor.

4 Claims, 4 Drawing Sheets

LED LIGHTING DEVICE

BACKGROUND OF THE INVENTION

1. Field of the Invention

The present invention relates to a lighting device, and in particular to a device utilizing light emitting diode (LED) as a light source.

2. The Prior Arts

LED is expected to replace incandescent light bulbs, fluorescent tubes, and even compact fluorescent light bulbs in the foreseen future because of its compactness, low heat production, low power consumption and long life span. In addition, due to the advancement in manufacturing technology, the brightness of LED is greatly enhanced, and its manufacturing cost is gradually reduced. Therefore, more and more traffic signals, indicators, advertisement billboards, and LCD display backlights utilize LED as a light source.

Conventionally, LED is soldered to a conventional circuit board or an aluminum-based board to serve as a light source. However, as the LED is directly soldered to the board, heat cannot be dissipated efficiently, which makes it subject to failure from overheated.

SUMMARY OF THE INVENTION

A primary objective of the present invention is to provide a lighting device utilizing light emitting diode as a light source, which not only has good lighting performance, but also has excellent heat-dissipating efficiency.

A feature of the present invention is a light emitting diode having a sandwich-like conductive pad set, which includes an upper positive conductive pad, a lower negative conductive pad, and an insulating pad disposed between the positive and negative conductive pads.

Another feature of the present invention is to dispose the light emitting diode on a seat and to have the negative conductive pad in contact with a conductor of the seat. The conductor is connected to a metal plate. An exterior enclosure is disposed on the seat, and is in contact with the positive conductive pad. A number of light emitting diodes may be disposed on the metal plate to configure a multiple light source structure with a common negative electrode.

A further feature of the present invention is to utilize the exterior enclosure and the metal plate to achieve the heat-dissipating effect. A heat-dissipating fin may be additionally attached to the metal plate to further enhance the heat-dissipating effect.

Accordingly, the present invention is to provide a seat having a conductor therein and a light emitting diode disposed thereon. The light emitting diode includes an upper positive conductive pad, a lower negative conductive pad, and an insulating pad disposed between the positive and negative conductive pads. The low negative conductive pad of the light emitting diode connects with the conductor. An exterior enclosure is disposed on top of the seat. A bottom of the exterior enclosure is in contact with the upper positive conductive pad and has a through hole defined thereon for receiving the light emitting diode. The bottom of the seat is connected with a metal plate that is in contact with the conductor.

The present invention will be apparent to those skilled in the art by reading the following detailed description of a preferred embodiment thereof, with reference to the attached drawings.

DETAILED DESCRIPTION OF THE PREFERRED EMBODIMENT

Figure 1:
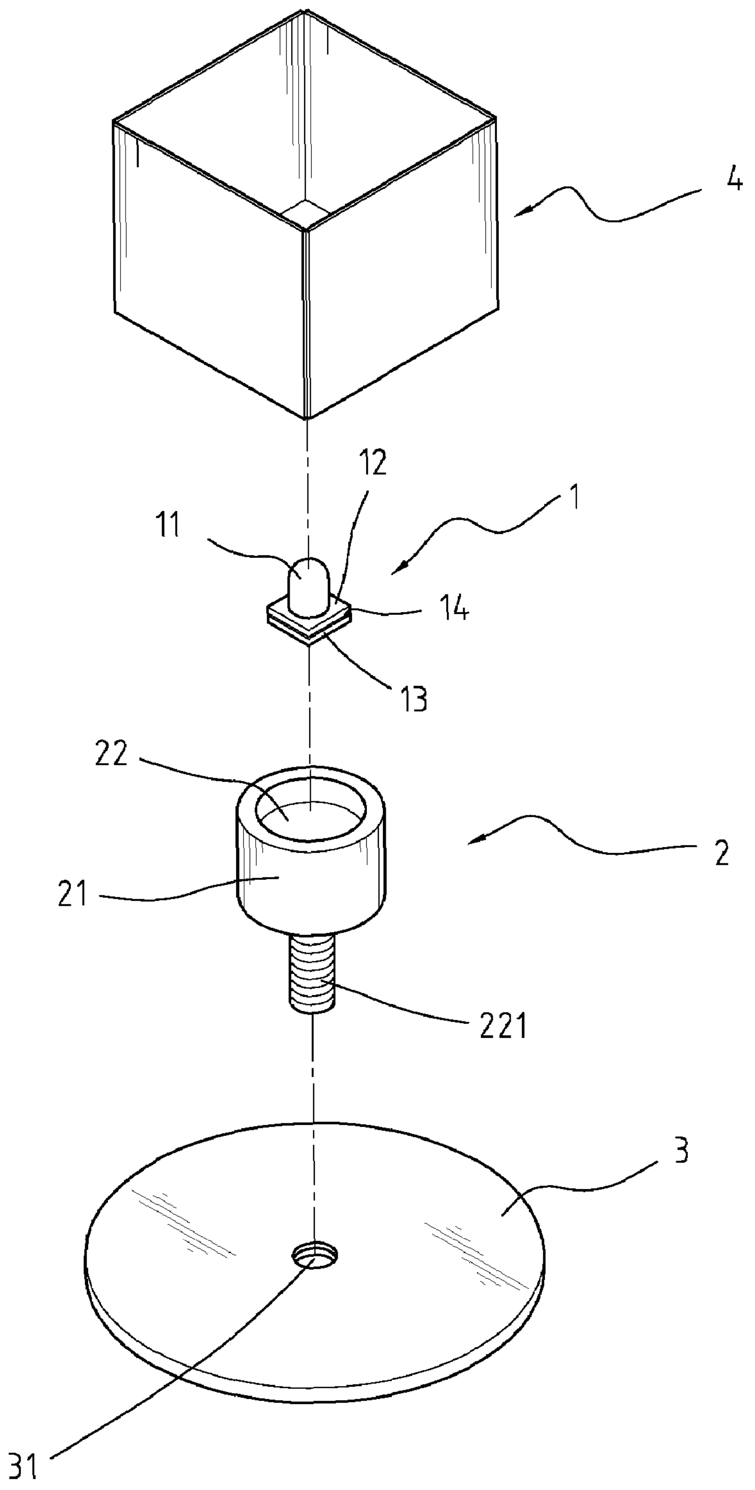
FIG. 1 is an exploded perspective view of an LED lighting device according to a preferred embodiment of the present invention.
Figure 2:
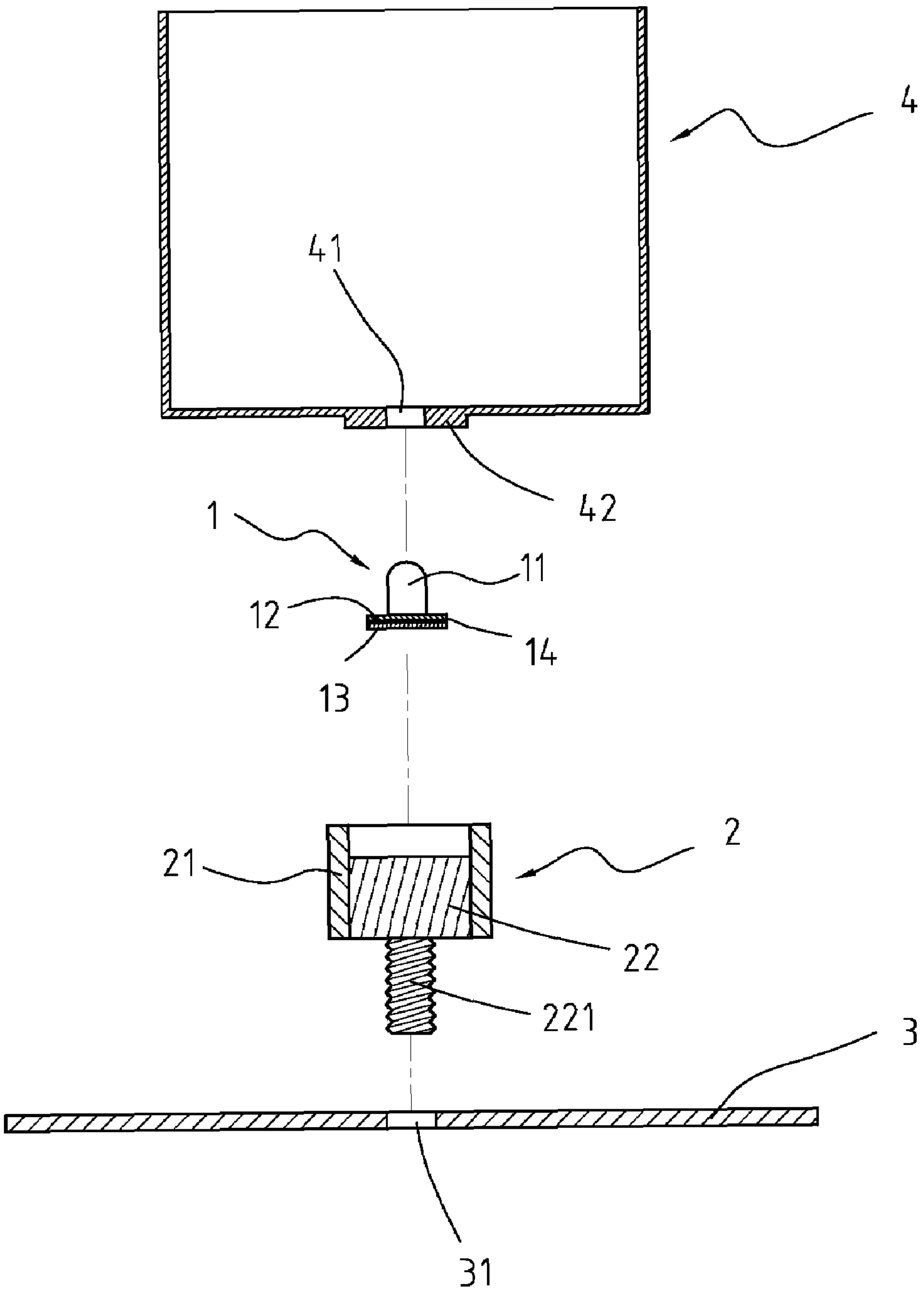
FIG. 2 is a cross-sectional view of FIG. 1.

With reference to FIGS. 1 and 2, an LED lighting device in accordance with a preferred embodiment of the present invention comprises a light emitting diode 1, a seat 2, a metal plate 3, and an exterior enclosure 4. The light emitting diode 1 includes a package unit 11 which has a chip sealed therein with resins. A bottom of the package unit 11 couples with an upper positive conductive pad 12 and a lower negative conductive pad 13 disposed under the upper positive conductive pad 12. An insulating pad 14 is disposed between the positive conductive pad 12 and the negative conductive pad 13 to form a sandwich-like conductive pad set.

The seat 2 in accordance with a preferred embodiment of the present invention has a tubular insulator 21 and a central conductor 22 received in the tubular insulator 21. An upper surface of the conductor 22 is lower than an upper end surface of the insulator 21, so that a recess is defined in an upper portion of the insulator 21. A screw 221 is extended from a bottom of the conductor 22.

The metal plate 3 is an electrically conductive base for holding the seat 2. A number of screw holes 31 may be formed on the metal plate 3 for engagement with corresponding screws 221 of the seats 2.

The exterior enclosure 4 includes an upper open end, a bottom end, and a peripheral wall that surrounds a periphery of the bottom end. A flange 42 protrudes downwardly from the bottom end of the exterior enclosure 4 and a through hole 41 is defined through the flange 42.

Figure 3:
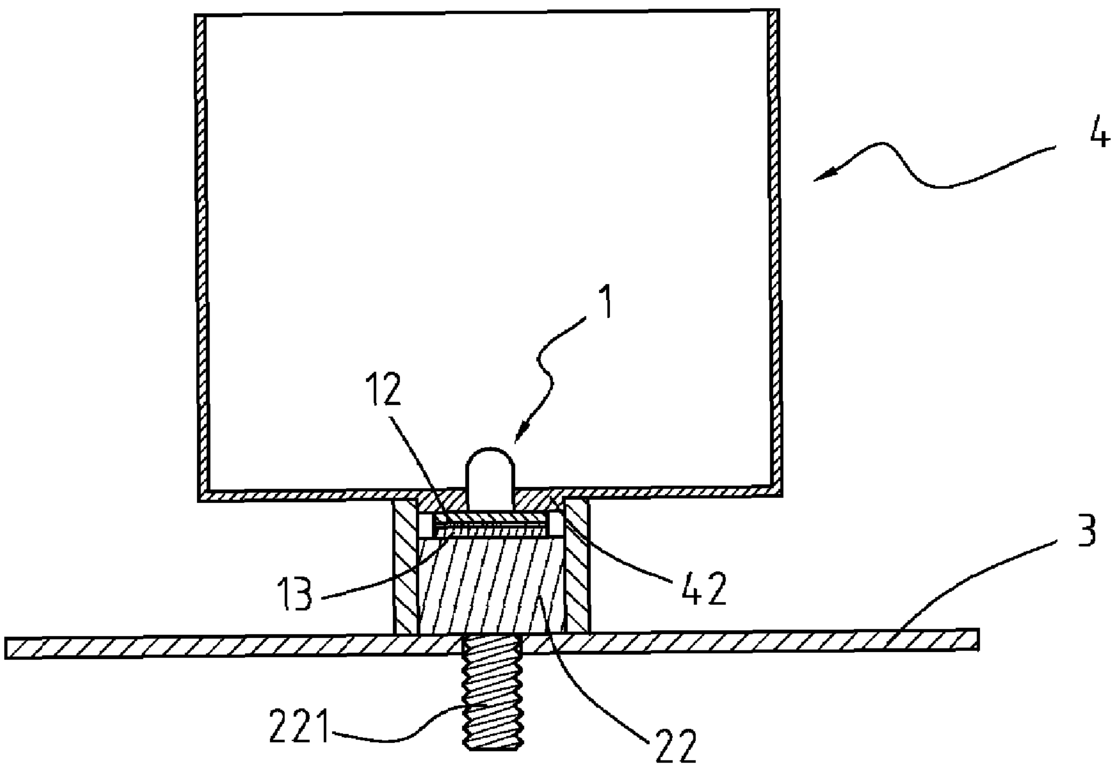
FIG. 3 is an assembled cross-sectional view of FIG. 1.

Referring to FIG. 3, the light emitting diode 1 is disposed in the recess at the upper portion of the seat 2 in such a way that the low negative conductive pad 13 is in contact with the conductor 22. Then the flange 42 of the exterior enclosure 4 is received into the recess of the seat 2 to be in contact with the upper positive conductive pad 12. The exterior enclosure 4 is fixed with the seat 2 with an adhesive or by soldering. The screw 221 under the seat 2 is engaged with the screw hole 31 of the metal plate 3, so that the low negative conductive pad 13 is in electrically connection with the metal plate 3 via the conductor 22 and the screw 221, which allows the metal plate 3 to function as a common negative electrode and as a base for installation of a number of light sources.

In addition, the exterior enclosure 4 and the metal plate 3 are both capable of absorbing and dissipating heat generated from the light emitting diode 1. A heat-dissipating fin (not shown) may be further attached to the metal plate 3 to enhance the overall heat-dissipating effect.

Figure 4:
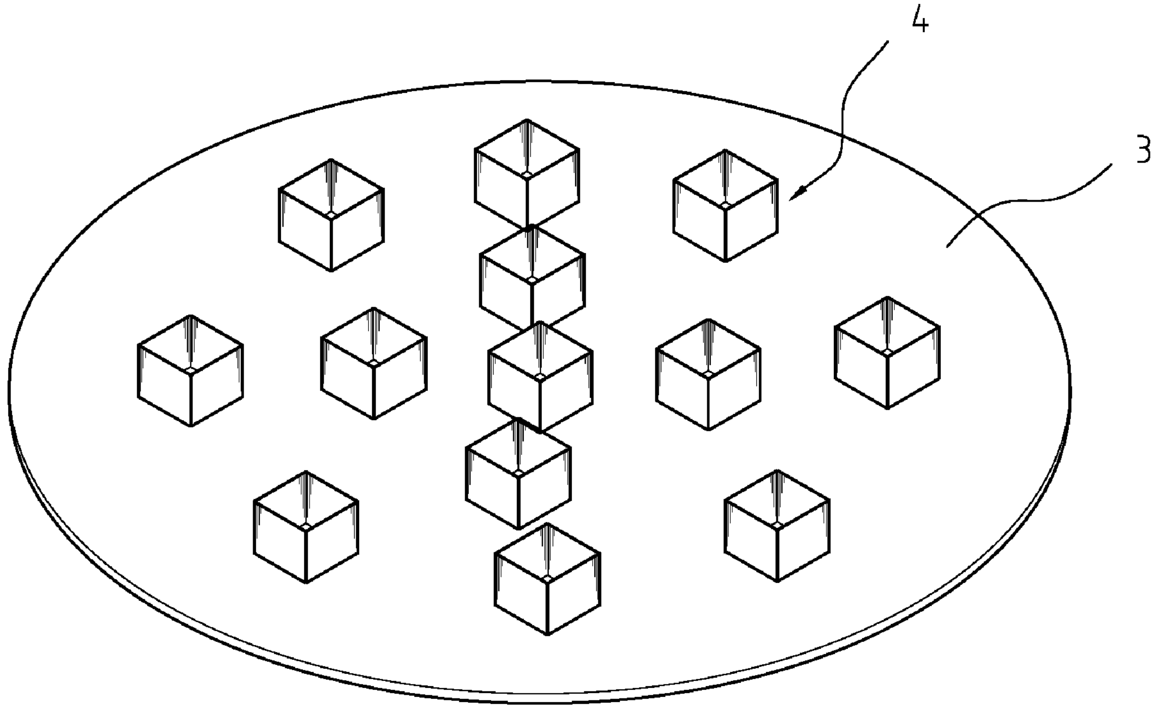
FIG. 4 shows a number of LED lighting devices of FIG. 1 installed on a metal plate to serve as a lighting device.

Referring to FIG. 4, a number of assembled LED 1, seat 2 and exterior enclosure 4 are installed on the metal plate 3 to function as a lighting device to serve as a street lamp or any other suitable light sources.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A light emitting diode lighting device, comprising:

a seat having a peripheral insulator and a central conductor received in said peripheral insulator;

a light emitting diode including an upper positive conductive pad, a lower negative conductive pad, and an insulating pad disposed between said upper positive conductive pad and said lower negative conductive pad, said light emitting diode disposed on said conductor of said seat so that said lower negative conductive pad is in contact with said conductor;

a metal plate connected with a bottom of said seat and being in contact with said conductor; and an exterior enclosure disposed on said seat and having a through hole, whereby said exterior enclosure is in contact with said upper positive conductive pad and said light emitting diode is inserted through said through hole.

2. The light emitting diode lighting device as claimed in claim 1, wherein said conductor has a screw extending from a bottom of said conductor, which is engaged with a screw hole defined in said metal plate.

3. The light emitting diode lighting device as claimed in claim 1, wherein said exterior enclosure includes an upper open end, a bottom end with said through hole formed thereof, a peripheral wall surrounding a periphery of said bottom end.

4. The light emitting diode lighting device as claimed in claim 3, wherein a flange through which the through hole is defined, is protruded from the bottom end of said exterior enclosure and is in contact with said upper positive conductive pad.

* * * * *